(12) United States Patent
Allen et al.

(10) Patent No.: US 7,542,599 B2
(45) Date of Patent: Jun. 2, 2009

(54) REDUCING NUMBER OF RELATIVELY UNIMPORTANT SHAPES FROM A SET OF SHAPES

(75) Inventors: Joseph B. Allen, Wappingers Falls, NY (US); Timothy G. Dunham, South Burlington, VT (US); Valarmathi C. Shanmugam, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 4 days.

(21) Appl. No.: 11/776,769

(22) Filed: Jul. 12, 2007

(65) Prior Publication Data

US 2008/0019585 A1    Jan. 24, 2008

Related U.S. Application Data

(62) Division of application No. 10/604,063, filed on Jun. 24, 2003, now Pat. No. 7,289,658.

(51) Int. Cl.
  *G06K 9/00* (2006.01)
(52) U.S. Cl. ...................................... 382/144
(58) Field of Classification Search ........................ None
  See application file for complete search history.

(56) References Cited

U.S. PATENT DOCUMENTS

| | | | |
|---|---|---|---|
| 4,005,411 A | 1/1977 | Morrin, II | |
| 4,589,140 A | 5/1986 | Bishop et al. | |
| 4,648,053 A * | 3/1987 | Fridge | ........................ 382/147 |
| 5,301,318 A | 4/1994 | Mittal | |
| 5,481,472 A | 1/1996 | Chung et al. | |
| 5,497,334 A | 3/1996 | Russell et al. | |
| 5,544,256 A | 8/1996 | Brecher et al. | |
| 5,699,266 A | 12/1997 | Chung et al. | |
| 5,923,554 A * | 7/1999 | Nakata | ........................ 700/110 |
| 6,009,250 A | 12/1999 | Ho et al. | |
| 6,009,251 A | 12/1999 | Ho et al. | |
| 6,011,911 A | 1/2000 | Ho et al. | |
| 6,063,132 A | 5/2000 | DeCamp et al. | |
| 6,415,421 B2 | 7/2002 | Anderson et al. | |
| 6,425,113 B1 | 7/2002 | Anderson et al. | |
| 6,470,477 B1 | 10/2002 | Scott | |
| 6,481,002 B2 | 11/2002 | Watanabe | |
| 6,536,015 B2 * | 3/2003 | Ono | ............................... 716/2 |
| 7,263,227 B2 * | 8/2007 | Simard | ........................ 382/195 |

* cited by examiner

*Primary Examiner*—Matthew C Bella
*Assistant Examiner*—Alex Liew
(74) *Attorney, Agent, or Firm*—Schmeiser, Olsen & Watts; Richard M. Kotulak

(57) ABSTRACT

A method for reducing a number of shapes, and a computer readable program code adapted to perform said method. The method forms first and second shape patterns. The second shape pattern includes the first shape pattern and error shapes. The error shapes are extracted from the second shape pattern. At least one environment shape corresponding to each error shape is derived from a subset of the error shapes. For example, each error shape in the subset may be expanded to form a corresponding expanded shape, and at least one environment shape corresponding to each expanded shape may be formed by removing all portions of the expanded shape common to the second shape pattern. The environment shape reflects a local geometric environment of its corresponding error shape. A subset of the environment shapes are deleted such that only unique environment shapes satisfying a selection criterion remain.

9 Claims, 11 Drawing Sheets

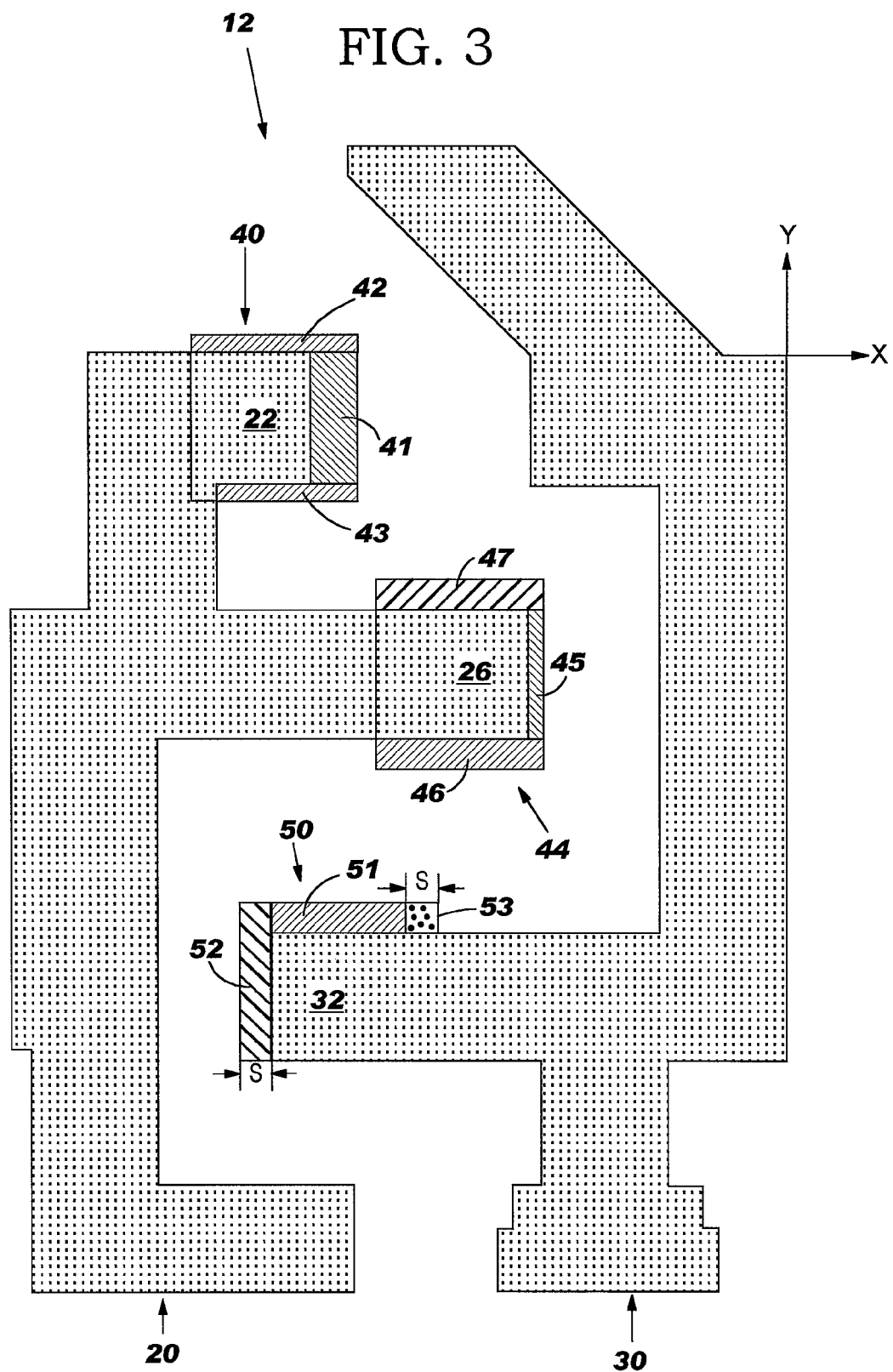

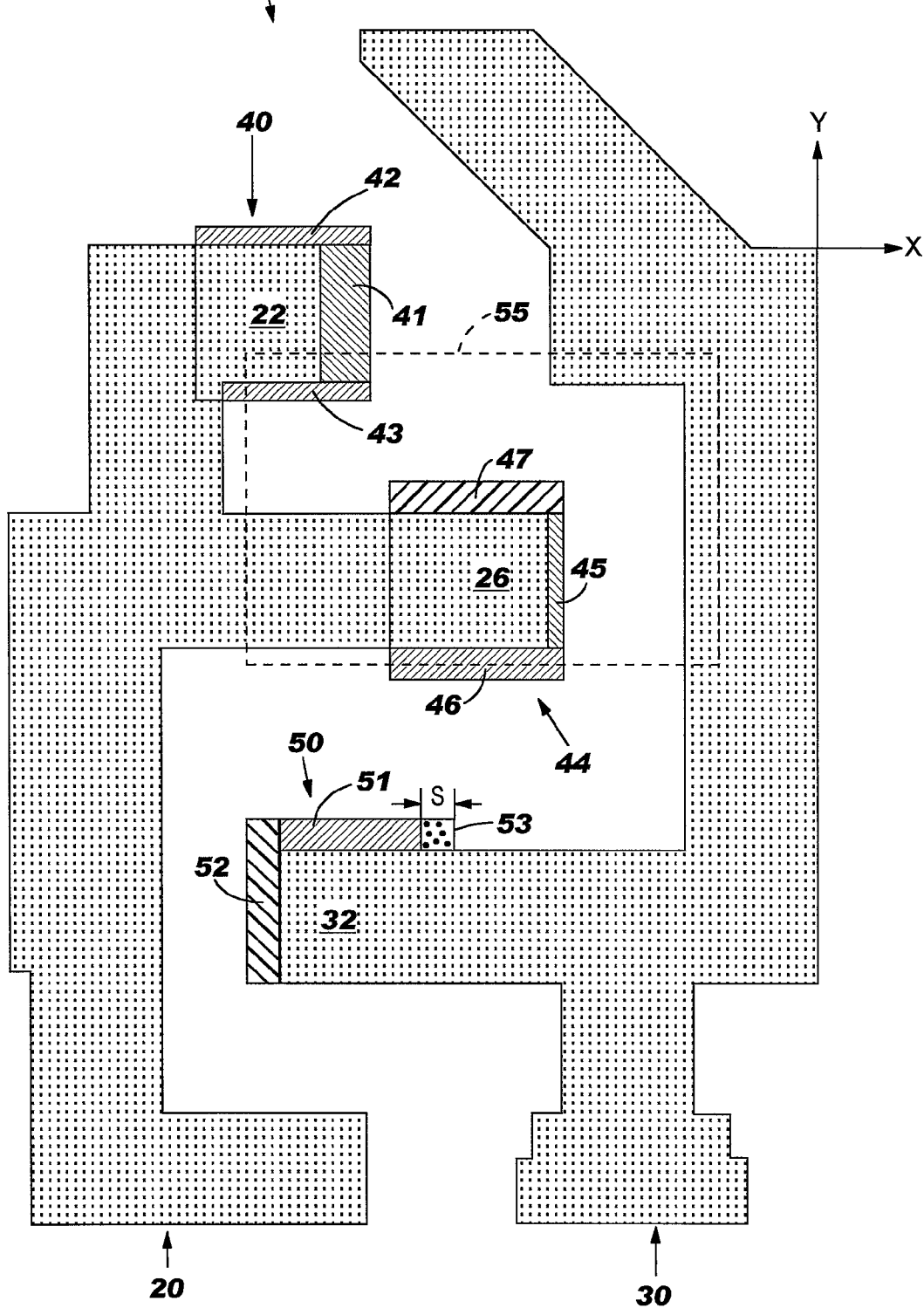

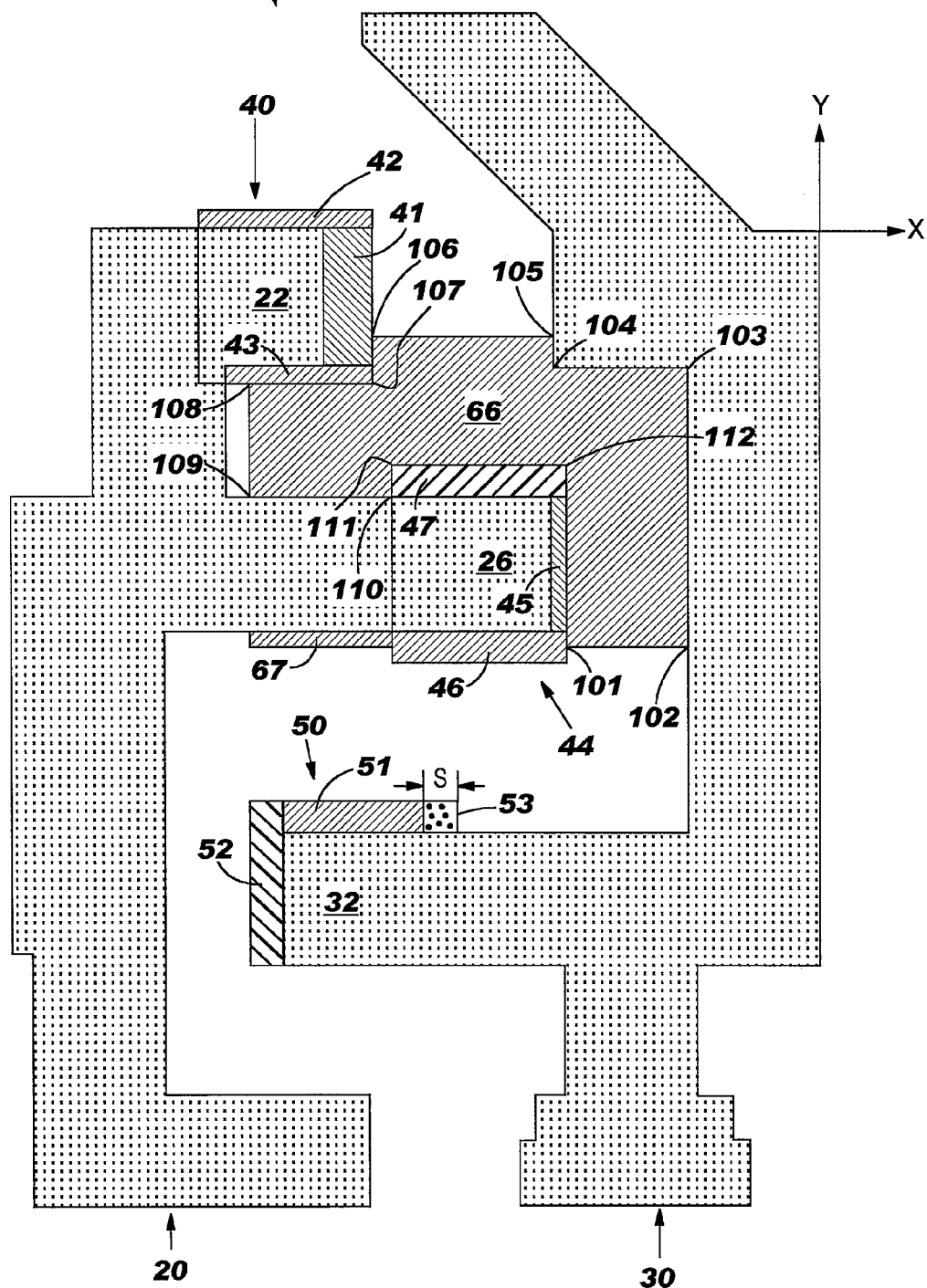

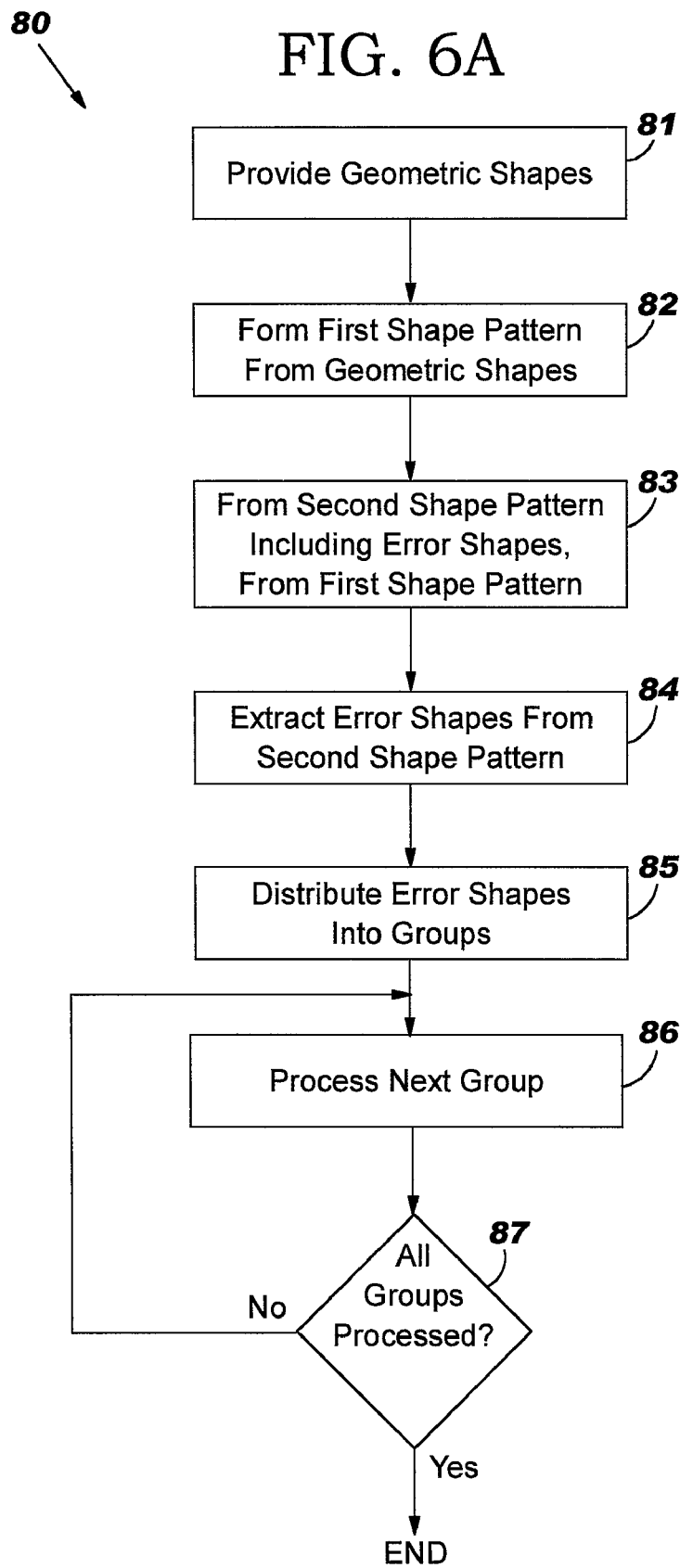

FIG. 7

| Number of Polygons (Environmental Shapes) | Resulting Number of Unique Polygons |
|---|---|
| 10661 rectangles | 83 unique rectangles |
| 1028245 polygons | 737 unique polygons |
| 16168 rectangles | 55 unique rectangles |
| 323487 polygons | 696 unique polygons |
| 23686 rectangles | 41 unique polygons |
| 408720 polygons | 680 unique polygons |
| 261003 rectanlges | 49 unique rectangles |
| 1164365 polygons | 463 unique polygons |
| 4082 rectangles | 6 unique rectangles |
| 13889 polygons | 37 unique polygons |
| 8465 rectangles | 16 unique rectangles |
| 606571 polygons | 529 unique polygons |
| 104476 rectangles | 52 unique rectangles |
| 695680 polygons | 431 unique polygons |
| 6610 rectangles | 9 unique rectangles |
| 30305 polygons | 100 unique polygons |
| 1000 rectangles | 9 unique rectangles |
| 2928 polygons | 55 unique polygons |
| 145 polygons | 12 unique polygons |
| 11231 rectangles | 6 unique rectangles |
| 23690 polygons | 109 unique polygons |
| 164 rectangles | 1 unique rectangle |
| 373 polygons | 13 unique polygons |
| 812 rectangles | 11 unique rectangles |
| 80973 polygons | 51 unique polygons |

REDUCING NUMBER OF RELATIVELY UNIMPORTANT SHAPES FROM A SET OF SHAPES

This application is a divisional of Ser. No. 10/604,063, filed Jun. 24, 2003.

BACKGROUND OF THE INVENTION

1. Technical Field

The present invention relates to removal of relatively unimportant shapes from a set of shapes.

2. Related Art

In the fabrication of semiconductor chips and integrated circuits from a substrate, masks are used for defining regions of a substrate in which fabrication steps, such as etching, are to be performed. In forming the mask, mask data defining geometric shapes are processed. Such processing of mask data is inefficient. Accordingly, there is a need for a method to process mask data efficiently.

SUMMARY OF THE INVENTION

The present invention provides a method for reducing a number of shapes, said method comprising the steps of:
  forming a first shape pattern;
  forming a second shape pattern, wherein the second shape pattern includes the first shape pattern and error shapes;
  extracting the error shapes from the second shape pattern;
  deriving from a subset of the error shapes at least one environment shape corresponding to each error shape in the subset of the error shapes, said environment shape reflecting a local geometric environment of its corresponding error shape; and
  deleting a subset of the environment shapes such that only unique environment shapes satisfying a selection criterion remain.

The present invention advantageously provides a method for processing mask data efficiently.

BRIEF DESCRIPTION OF THE DRAWINGS

FIG. 3 depicts FIG. 2 after error shapes have been added to the first shape pattern to form a second shape pattern, in accordance with embodiments of the present invention.

FIG. 4A depicts FIG. 3 after an error shape has been expanded into an expanded shape, in accordance with embodiments of the present invention.

FIG. 5 depicts FIG. 4A after overlapping portions of the second shape pattern have been removed from the expanded shape to form an environment shape, in accordance with embodiments of the present invention.

FIGS. 6A-6B is a flow chart describing a method which includes removing relatively unimportant error shapes from a set of error shapes, in accordance with embodiments of the present invention.

FIG. 7 is a table showing results in terms of the number of unique polygons resulting from applying the methodology of FIG. 6B to a large number of environment shapes for each of several examples depicted in the table.

DETAILED DESCRIPTION OF THE INVENTION

A data preparation algorithm may be employed for building a mask that will be subsequently utilized in the fabrication of a semiconductor chip or an integrated circuit. The data preparation algorithm accepts a base geometry of geometric shapes for input, and generates a shape pattern as output. The outputted shape pattern reflects the specifics of the data preparation algorithm. The first time the data preparation algorithm is executed with the inputted base geometry, a first shape pattern is outputted. When a change is made to the data preparation algorithm and the changed data preparation algorithm is run for a second time with the same inputted base geometry, a second shape pattern is outputted. The second shape pattern may differ the first shape pattern in that the second shape pattern may contain "error shapes" not present in the first shape pattern. The error shapes may include additive shapes and subtractive shapes. Additive shapes are error shapes added to the first shape pattern and are thus physically present in the second shape pattern, while the subtractive shapes are error shapes subtracted from the first shape pattern and are thus physically absent from the second shape pattern but are nonetheless tracked along with the second shape pattern. The error shapes are each a potential source of error (or of design impact) and each error shape may be analyzed for its potential error impact or other design impact. In practice, there may be millions, and even tens of millions, of such error shapes generated. The analysis of said error shapes may therefore be very time consuming. A large percentage of the error shapes may not have to be analyzed, however, because many error shapes may have similar environments within the mask, and also because the potential effect may be negligible for many error shapes for a variety of reasons such as, inter alia, the size of many error shapes may be small enough that the potential error effect is negligible. Accordingly, the present invention discloses methodology for identifying those error shapes that do not have to be analyzed. For example, the present invention finds the environment signature of each error shape in terms of its environment within the overall mask geometry and removes those error shapes whose environment signature is not unique relative to the environment signatures of the other error shapes or whose potential error impact (or other design impact) is negligible as determined through selection criteria involving the environment signatures. Thus by discarding many error shapes, the methodology of the present invention substantially reduces the overall effort of analyzing the error shapes for their potential error impact or other design impact.

Figure 1:
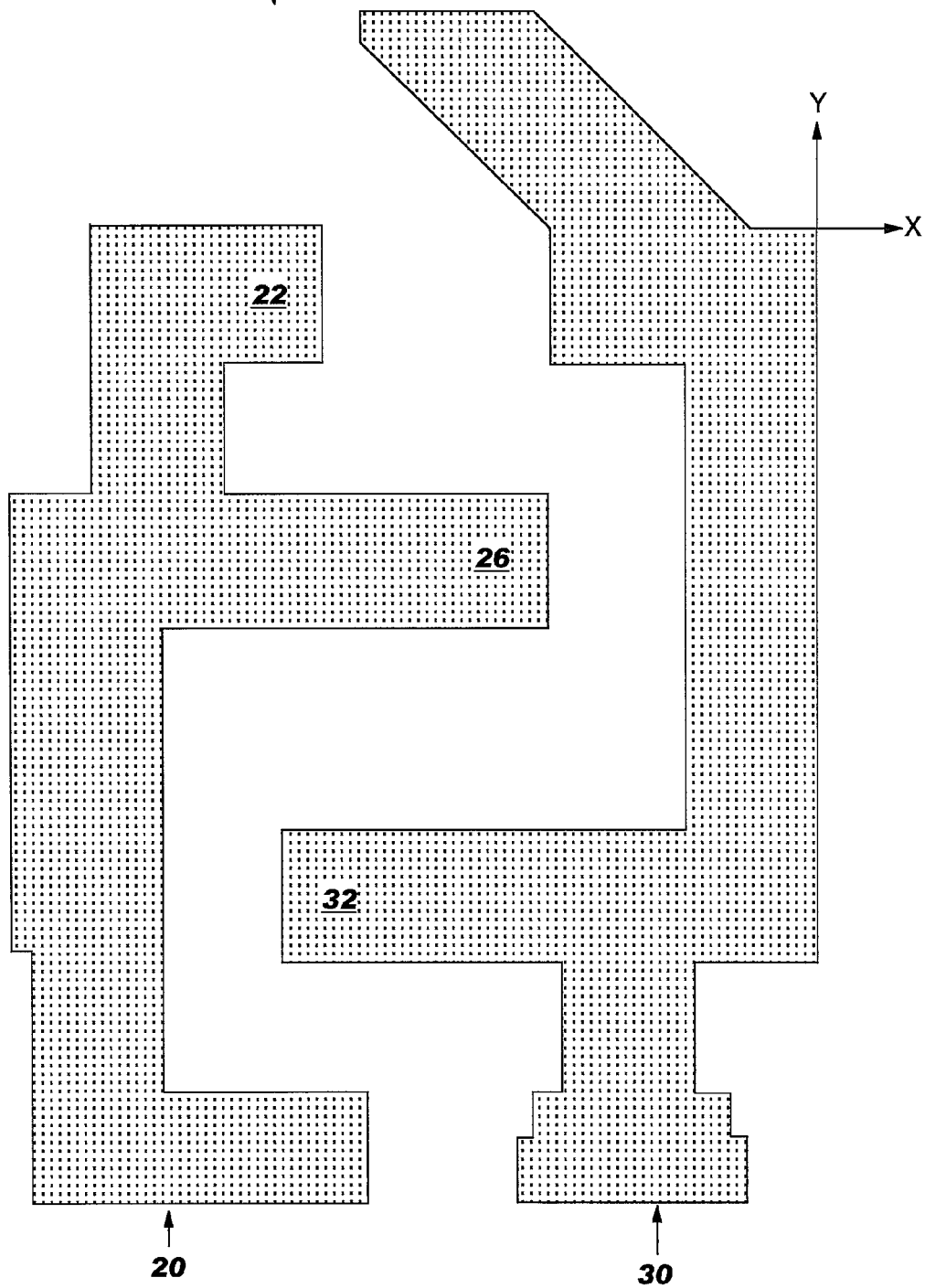
FIG. 1 depicts a top view of a base geometry having initial geometric shapes, in accordance with embodiments of the present invention.

FIG. 1 depicts a top view of a base geometry 10 having initial geometric shapes 20 and 30 expressed in a X-Y rectangular coordinate system, in accordance with embodiments of the present invention. Portions 22 and 26 of shape 20, and portion 32 of shape 30, each has its length oriented in the X direction. The initial shapes 20 and 30 of the base geometry 10 are intended to be subsequently used by a data preparation algorithm for building a mask that will be utilized in the fabrication of a semiconductor chip or integrated circuit. The base geometry 10 may correspond to, inter alia, a single level (e.g., device level or interconnect level) of an integrated circuit. While FIG. 1 depicts the base geometry 10 as having two geometric shapes, namely geometric shapes 20 and 30, the base geometry of the present invention generally has one or more geometric shapes.

Figure 2:
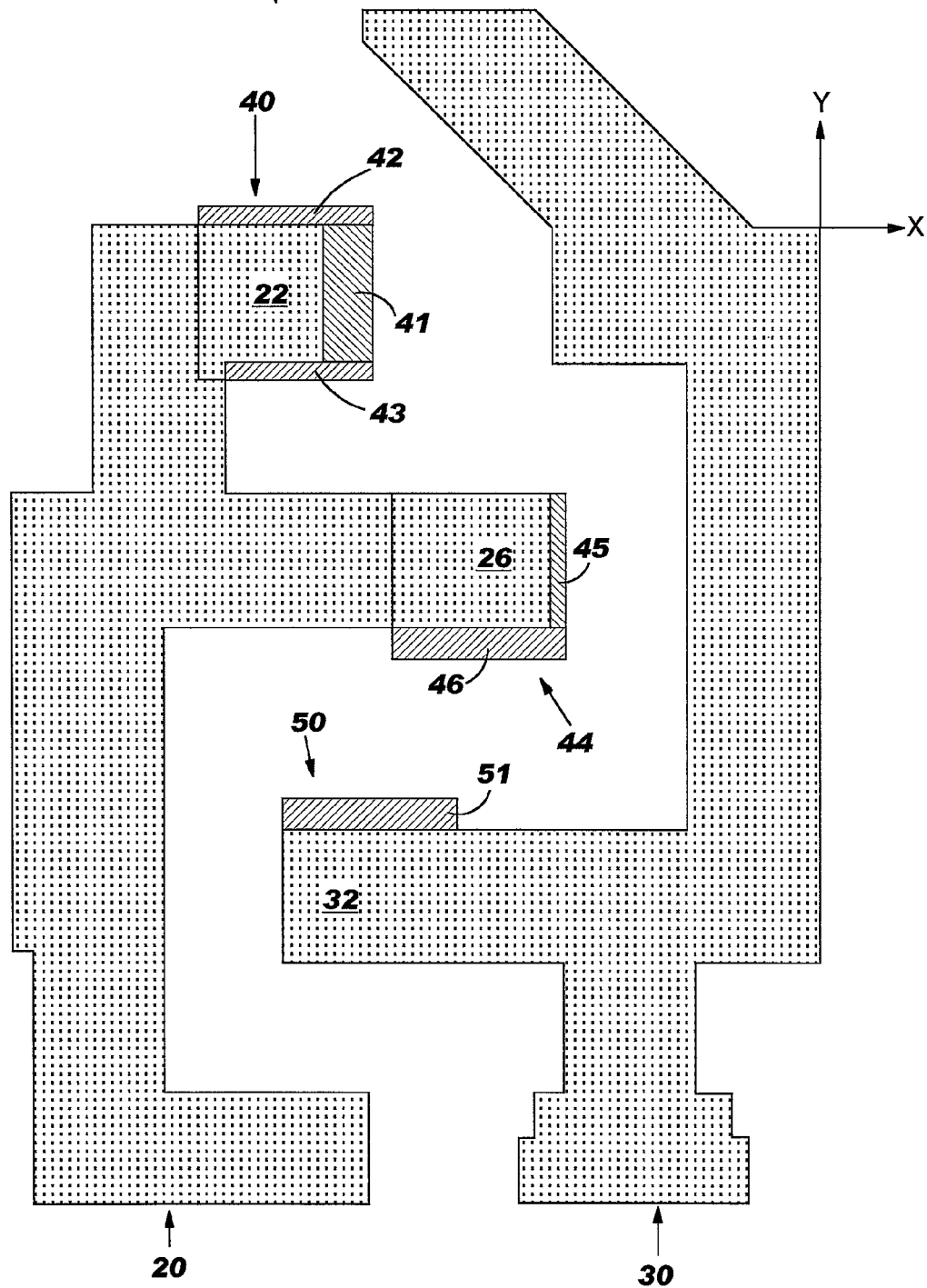
FIG. 2 depicts FIG. 1 after anchors have been added to the base geometry to form a first shape pattern, in accordance with embodiments of the present invention.

In FIG. 2, a first shape pattern 11 is formed by adding anchors to portions of the shapes of the base geometry 10 of FIG. 1, in accordance with embodiments of the present invention. FIG. 2 represents a first output of the data preparation algorithm that accepts the base geometry 10 (see FIG. 1) as input. In FIG. 2, the data preparation algorithm adds anchors to portions of the shapes of the base geometry 10 of FIG. 1 as dictated by methodology incorporated into the data preparation algorithm. In FIG. 2, anchors 40, 44, and 50 have been respectively added: to the portion 22 of shape 20, to the portion 26 of shape 20, and to the portion 32 of shape 30.

An anchor comprises at least one of an extension and at least one flare. An extension added to a portion of a shape is formed by extending the portion in the same direction in which the portion is oriented (i.e., along the "length" direction of the portion). A flare added to a portion of a shape is formed by extending the portion in a direction that is perpendicular to the direction in which the part is oriented (i.e., along the "width" direction of the portion).

The anchor 40 comprises extension 41 and the flares 42 and 43. Noting that the portion 22 is oriented in the X direction, the extension 41 was formed by extending the portion 22 in the X direction by a distance that is determined by the data preparation algorithm. After the extension 41 was formed, the flare 42 was formed by extending the portion 22 (including the extension 41) in the +Y direction by a distance that is determined by the data preparation algorithm, and the flare 43 was formed by extending the portion 22 (including the extension 41) in the −Y direction by a distance that is determined by the data preparation algorithm. Alternatively, the extension 41 could have been formed after formation of the flares 42 and 43.

The anchor 44 comprises extension 45 and the flare 46. Noting that the portion 26 is oriented in the X direction, the extension 45 was formed by extending the portion 26 in the X direction by a distance that is determined by the data preparation algorithm. After the extension 45 was formed, the flare 46 was formed by extending the portion 26 (including the extension 45) in the −Y direction by a distance that is determined by the data preparation algorithm. Alternatively, the extension 41 could have been formed after the flares 42 and 43. A difference between the anchors 40 and 44 is that anchor 40 has one extension and two flares, while anchor 40 has one extension and one flare.

The anchor 50 comprises the flare 51 and no extensions. Noting that the portion 32 is oriented in the X direction, the flare 51 was formed by extending the portion 32 in the +Y direction by a distance that is determined by the data preparation algorithm. A difference between the anchor 50 and the anchors 40 and 44 is that anchor 50 has no extensions, while anchors 40 and 44 each have one extension.

In FIG. 3, a second shape pattern 12 is formed by adding error shapes 47, 52, and 53 to first shape pattern 11 of FIG. 2, in accordance with embodiments of the present invention. FIG. 3 represents a second output of the data preparation algorithm that accepts the base geometry 10 (see FIG. 1) as input. In FIG. 3, the data preparation algorithm adds the error shapes 47, 52, and 53 as a consequence of a change to the data preparation algorithm. The error shapes 52 and 53 are were generated by shifting the portion 32 of shape 30, together with the flare 51, in the −X direction by a distance S. Thus, the error shapes 52 and 53 each have a thickness of magnitude S in the X direction as indicated. The error shape 52 is an additive shape which physically exists in the second shape pattern 12. The error shape 53 is a subtractive shape which does not physically exists in the second shape pattern 12, but is logically present in the second shape pattern 12 so that the error shape 53 can be identified and analyzed for its potential error impact or other design impact. The error shape 47 is an additive shape that was generated by moving the portion 26 of shape 20, including where the extension 45 is located, in the +Y direction. Although the error shapes 47, 51, and 52 in FIG. 4A are rectangular, the error shapes may be polygonal; i.e., the error shape is a polygon having N sides, wherein N is at least 3. Alternatively, the error shape may be any shape enclosed within a closed curve (e.g., polygonal, circular, elliptical, etc.).

Figure 4B:
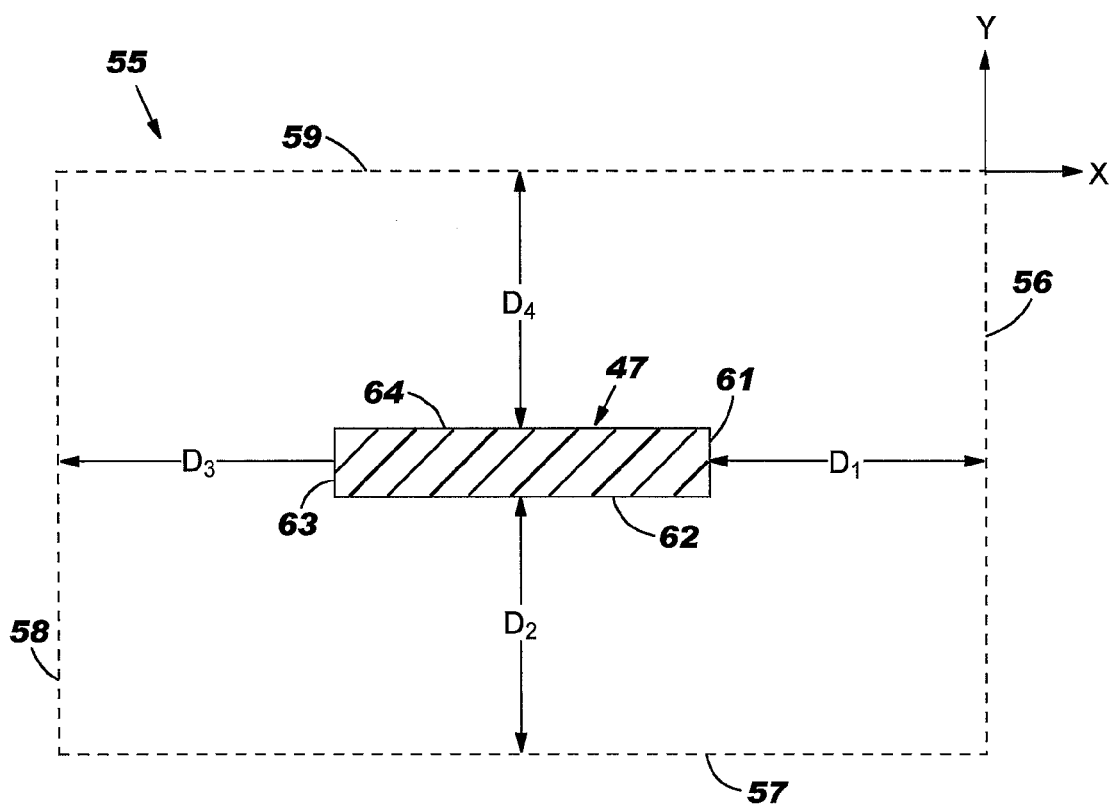
FIG. 4B is enlarged view of the expansion of the error shape of FIG. 4A, in accordance with embodiments of the present invention.

FIG. 4A depicts FIG. 3 after the error shape 47 has been expanded to the expanded shape 55, in accordance with embodiments of the present invention. Although the only error shape shown to be expanded in FIG. 4A is the error shape 47, the scope of the present invention includes expansion of up to all of such error shapes. Thus, although the error shapes 52 and 53 may be expanded, such expansion of the error shapes 52 and 53 is not depicted in FIG. 4A for simplicity inasmuch as depiction of the expansion of the error shape 47 to the expanded shape 55 sufficiently illustrates the concept of expansion of an error shape. Note, however, that the present invention does not require all error shapes to be expanded, since it may be possible to eliminate some error shapes from further consideration by analyzing specific properties of the error shapes, as will be explained infra. Generally, a polygonal error shape is expanded by outwardly projecting each bounding side of the polygonal error shape by a distance in a direction perpendicular to the bounding side, as will be illustrated infra in FIGS. 4B and 4C. If the error shape is non-polygonal with a continuously curved boundary segment, however, then expanding the error shape comprises outwardly projecting each point on the boundary segment by a distance in a direction perpendicular to the boundary segment at each point. Thus projecting a bounding side (curved or linear) may comprise outwardly projecting each point on the boundary segment by a distance in a direction perpendicular to the boundary segment at each point.

FIG. 4B is enlarged view of the expansion of the error shape 47 to the expanded shape 55, in accordance with embodiments of the present invention. In FIG. 4B, the error shape 47 has the sides 61, 62, 63, and 64, and the expanded shape 55 has corresponding sides 56, 57, 58, and 59, respectively. The expanded shape 55 been generated by outwardly projecting each of side of the error shape 47 in a direction perpendicular to said side by a displacement distance. The side 61 of the error shape 47 was outwardly projected in the +X direction by a distance $D_1$ to form the side 56 of the expanded shape 55. The side 62 of the error shape 47 was outwardly projected in the −Y direction by a distance $D_2$ to form the side 57 of the expanded shape 55. The side 63 of the error shape 47 was outwardly projected in the −X direction by a distance $D_3$ to form the side 58 of the expanded shape 55. The side 64 of the error shape 47 was outwardly projected in the +Y direction by a distance $D_4$ to form the side 59 of the expanded shape 55. The distances $D_1$, $D_2$, $D_3$, and $D_4$ may be application dependent or application independent. In some embodiments $D_1=D_2=D_3=D_4$. In other embodiments, $D_1=D_3$ which means that all distances representing outward projections in the "length" direction of the error shape 47 are the same. In yet other embodiments, $D_2=D_4$ which means that all distances representing outward projections in the "width" direction of the error shape 47 are the same. Generally, the distances $D_1$, $D_2$, $D_3$, and $D_4$ may be independent of one another. For other error shapes (i.e., other than the error shape 47), the expansion distances to be used for expanding the other error shapes may be related to or identical with the expansion distances $D_1$, $D_2$, $D_3$, and $D_4$ used for expanding the error shape 47 or may be independent of the expansion distances $D_1$, $D_2$, $D_3$, and $D_4$ used for expanding the error shape 47.

Figure 4C:
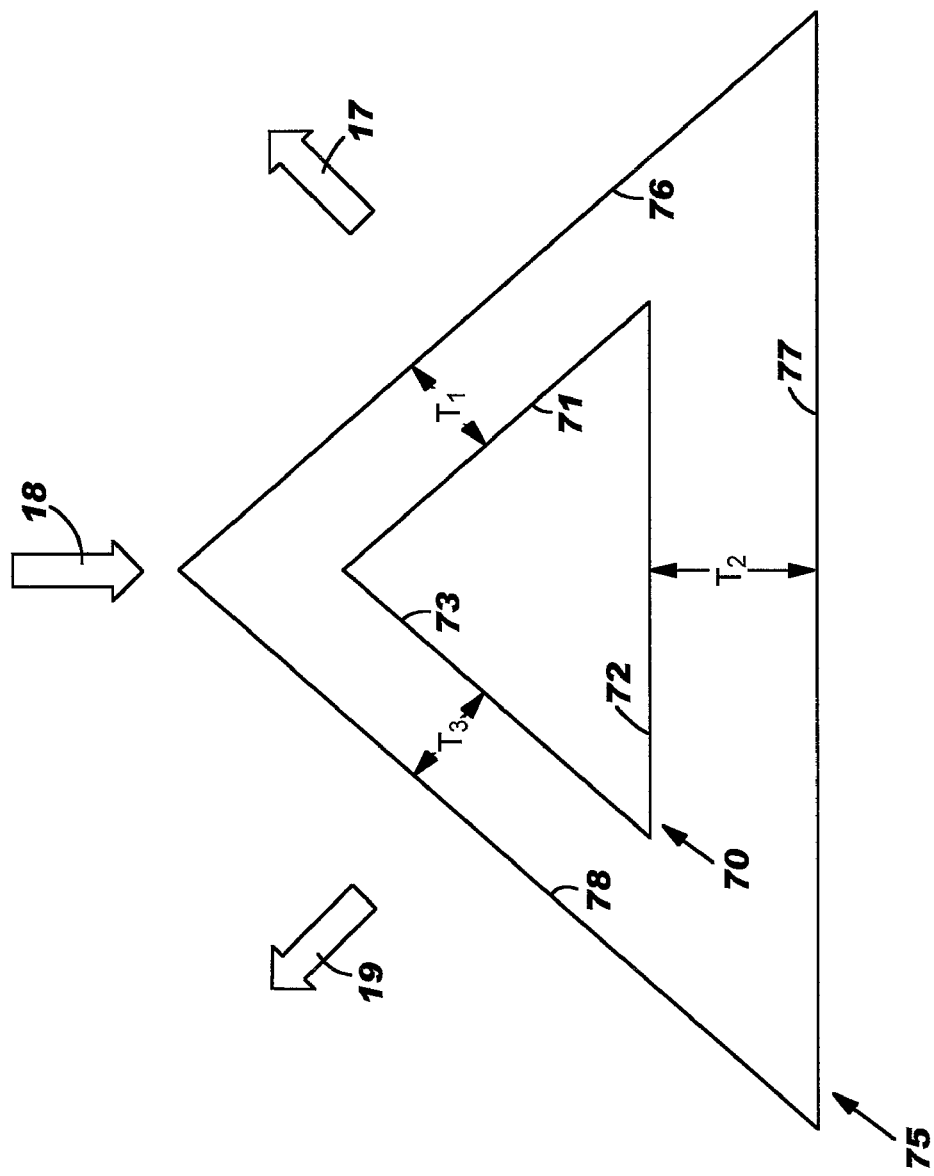
FIG. 4C depicts expansion of a triangular error shape, in accordance with embodiments of the present invention.

As stated supra in conjunction with FIG. 3, although the error shapes 47, 51, and 52 in FIG. 4A are rectangular, the error shapes are generally polygonal. Accordingly, FIG. 4C depicts expansion of a triangular error shape to further illustrate how expansion of an error shape is accomplished, in accordance with embodiments of the present invention. In FIG. 4C, the triangular error shape 70 has sides 71, 72, and 73 which are respectively outwardly expanded to form the triangular expanded shape 75 having corresponding sides 76, 77, and 78, respectively. The side 71 of the triangular error shape 70 was outwardly projected in the direction 17 by a distance $T_1$ to form the side 76 of the triangular expanded shape 70, and the direction 17 is perpendicular to the side 71. The side 72 of the triangular error shape 70 was outwardly projected in the direction 18 by a distance $T_2$ to form the side 77 of the triangular expanded shape 70, and the direction 18 is perpendicular to the side 72. The side 73 of the triangular error shape 70 was outwardly projected in the direction 19 by a distance $T_3$ to form the side 78 of the triangular expanded shape 70, and the direction 19 is perpendicular to the side 73. The distances $T_1$, $T_2$, and $T_3$ may be application dependent or application independent. In some embodiments $T_1=T_2=T_3$. In other embodiments, any two sides of $T_1$, $T_2$, and $T_3$ may be equal to each other. Generally, the distances $T_1$, $T_2$, and $T_3$ may be independent of one another. For other triangular error shapes, the expansion distances to be used for expanding the other triangular error shapes may be related to or identical with the expansion distances $T_1$, $T_2$, and $T_3$ used for expanding the triangular error shape 70 or may be independent of the expansion distances $T_1$, $T_2$, and $T_3$ used for expanding the triangular error shape 70.

FIG. 5 depicts FIG. 4A after overlapping portions of the second shape pattern 12 have been removed from the expanded shape 55 to form environment shapes 66 and 67, in accordance with embodiments of the present invention. The environment shape 66 is a polygon of 12 sides defined by vertices 101-112 in sequence. The environment shape 67 is a rectangle. The environment shapes 66 and 67 collectively constitute the environment signature of the error shape 47, and the environment shapes 66 and 67 therefore collectively reflect a local geometric environment of the error shape 47. As can be seen in FIG. 5, the environment shape 67 is much smaller than the environment shape 66; thus the environment shape 67 forms a relatively less important component of the environment signature of the error shape 47 than does the environment shape 66. There are several alternatives for treating an environment signature having a multiplicity of environment shapes. A first alternative is to select one of the environment shapes from the multiplicity of environment shapes as representing the environment signature. The selection of the representative environment shapes may be based on a selection criterion such as selecting that environment shape that is more representative of the signature environment than are the other environment shapes (e.g., largest enclosed area, greatest number of polygon vertices, etc.). A second alternative is to retain two or more environment shapes from the multiplicity of environment shapes, wherein said as two or more environment shapes collectively represent the environment signature. A third alternative is to consider each environment shape of the multiplicity of environment shapes as an independent environment signature of the error shape. With the third alternative, the error shape has more than one environment signature. Thus in FIG. 5, the environment signature of the error shape 47 may consist of, inter alia, environment shape 66 alone, environment shapes 66 and 67 as a collection, or environment shapes 66 and 67 individually.

Figure 6B:
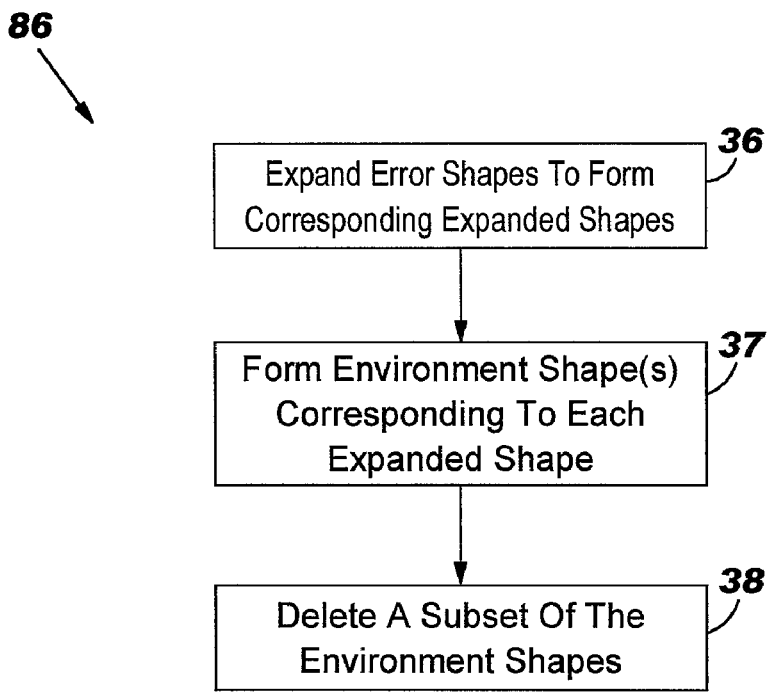

FIGS. 1-5 have described techniques of generating an environmental signature (in terms of environment shapes) associated with an error shapes. FIGS. 6A and 6B will next describe how error shapes and their associated environmental signatures may be processed so as to substantially reduce the total number of such error shapes that need to be analyzed for their potential error impact or other design impact.

FIGS. 6A and 6B (collectively, "FIG. 6") is a flow chart 80 describing a method which includes removing relatively unimportant error shapes from a set of error shapes, in accordance with embodiments of the present invention. FIG. 6A comprises steps 81-87, and FIG. 6B provides details for step 86 of FIG. 6A.

In FIG. 6A, step 81 of the flow chart 80 provides a base geometry of geometric shapes, such as the geometric shapes 20 and 30 of the base geometry 10 depicted in FIG. 1 and described supra.

Step 82 forms a first shape pattern from the base geometry provided in step 81, such as first shape pattern 11 depicted in FIG. 2 and described supra.

Step 83 forms a second shape pattern, including error shapes, from the first shape pattern formed in step 82, such as the second shape pattern 12 (including error shapes 47, 52, and 53) depicted in FIG. 3 and described supra.

Step 84 extracts the error shapes in the second shape pattern formed in step 83 by any applicable method such as by performing the logical operation $P_1$ XOR $P_2$, wherein $P_1$ and $P_2$ respectively denote the first shape pattern formed in step 82 the second shape pattern formed in step 83.

Step 85 distributes the error shapes extracted from step 84 into G groups such that G is at least 1 (e.g., G=1, G≧1, G=2, G≧2, etc.) in accordance with a grouping criterion. The grouping criterion may involves one or more characteristics of the error shapes. Such characteristics may include, inter alia, area, perimeter, any linear dimension such as length (longest linear dimension) or width (smallest linear dimension), etc. Non-limiting examples of grouping criteria are as follows.

First Example of Grouping Criterion

Distribute the error shapes into two groups $G_1$ and $G_2$ such that all error shapes having an area A less than a threshold value of $A_{TH}$ belong to group $G_1$, while the remaining error shapes belong to group $G_2$.

Second Example of Grouping Criterion

Set $A_{TH}$ to a very high value (e.g., $10^{30}$ microns) in the First Example supra such that $A<A_{TH}$ is satisfied for all error shapes, which forces all error shapes to belong to one group, namely $G_1$.

Third Example of Grouping Criterion

Assuming that each error shape has a width $W_I$ (in the expressed as I×ΔW, wherein ΔW is a unit grid size and I is a positive integer 1, 2, . . . , M, then distribute the error shapes into 2M groups (denoted as groups $G_{11}$, $G_{12}$, . . . , $G_{1M}$, $G_{21}$, $G_{22}$, . . . , $G_{2M}$) wherein all error shapes having the width I×ΔW and having an area less than a threshold value of $A_{TH}$ belong to group $G_{1I}$ (I=1,2, . . . , M), and all error shapes having the width I×ΔW and having an area of at least the threshold value $A_{TH}$ belong to group $G_{2I}$ (I=1,2, . . . , M).

Fourth Example of Grouping Criterion

Distribute the error shapes into four groups $G_{11}$, $G_{12}$, $G_{21}$, and $G_{22}$ as follows, assuming that each error shape has a length L and an area A and also assuming a threshold area $A_{TH}$ and a threshold length $L_{TH}$:

|  | $L < L_{TH}$ | $L \geq L_{TH}$ |
|---|---|---|
| $A < A_{TH}$ | Group $G_{11}$ | Group $G_{12}$ |
| $A \geq A_{TH}$ | Group $G_{21}$ | Group $G_{22}$ |

Steps 86-87 define a loop for processing K groups of the G groups established in step 85, wherein $1 \leq K \leq G$. K may be less than G, since not all groups established in step 85 are necessarily processed in steps 86-87. For example, a group established in step 85 having no more than one error shape will not be processed in steps 86-87. As another example, a group established in step 85 may be disregarded and thus not processed in steps 86-87 if the group, as characterized by its error shape characteristics, is considered to be relatively unimportant (e.g., the error shape area A characteristic of all of the error shapes in the group is negligibly small), such that the group's included error shapes need not be analyzed for their potential error impact or other design impact.

Step 86 processes the next group as described infra in conjunction with FIG. 6B. For the K groups denoted as $G_1$, $G_2$, ..., $G_K$), the method processes the groups in K iterations of the loop in the sequential order of $G_1$, $G_2$, ..., $G_K$. In the first iteration, the "next group" is group $G_1$. After group $G_k$ is processed (k=1, 2, ..., K−1), the "next group" in the next iteration is group $G_{k+1}$. Step 87 determines whether all K groups have been processed. If step 87 determines that all K groups have been processed, then the method ends. If step 87 determines that all K groups have not been processed, then the method return to step 86 to execute the next iteration of the loop for the next group.

FIG. 6B describes step 86 of FIG. 6A for the error shapes in the "next group".

In FIG. 6B, step 36 expands each error shape of the group into an expanded shape, such as the expansion of error shape 47 into the expanded shape 55 depicted in FIG. 4A and described supra.

Step 37 forms at least one environment shape corresponding to each expanded shape resulting from step 36, by removing all portions of the expanded shape which are common to the second shape pattern formed in step 83 of FIG. 6A. An example of step 37 is the formation of environmental shapes 66 and 67 in FIG. 5 by removal of all portions the expanded shape 55 of FIG. 4A which are common to the second shape pattern 12.

Step 38 deletes a subset of the environment shapes from the group such that only unique environment shapes satisfying a selection criterion remain in the group; i.e., the selection criterion "selects" those error shapes to remain in the group. The selection criterion that selects the error shapes to remain in the group is expressed in terms of characteristics of the environment shapes associated with the error shapes. Although the group contents may be expressed as error shapes, the group contents may alternatively be expressed as the environment shapes associated with said error shapes. Thus, the selection criterion directly selects environment shapes to remain in the group, which impliedly selects the error shapes which are associated with the selected environment shapes. The characteristics of the environment shapes used in the selection criterion may include, inter alia, vertex count (i.e., number of vertices in the environmental shape polygon), area of environmental shape, perimeter of environmental shape, any linear dimension of the environmental shape such as length (longest dimension) or width (shortest dimension), etc. Non-limiting examples of selection criteria are as follows:

First Example of Selection Criterion

Select those environment shapes whose area A is at least a threshold area $A_{TH}$.

Second Example of Selection Criterion

Select those environment shapes whose vertex count V, area A, and perimeter P satisfy: $V_{MIN} \leq V \leq V_{MAX}$, $A \geq A_{MIN}$, and $P \geq P_{MIN}$, wherein $V_{MIN}$ is a minimum vertex count, $V_{MAX}$ is a maximum vertex count, $A_{MIN}$ is a minimum area, and $P_{MIN}$ is a minimum perimeter.

Third Example of Selection Criterion

Select those environment shapes having a vertex count of at least 4.

Fourth Example of Selection Criterion

Select those environment shapes whose vertex count V is a given value, whose area A is within a given range of areas, and whose perimeter P is within a given range of perimeters.

As illustrated in the preceding selection criterion examples, the selection criteria may relate to N characteristics of each environment shape such that N is at least 1. Sorting based on the N characteristics associated with the selection criterion may be a convenient and practical way to implement selection of the environment shapes to remain in the group, or equivalently deletion of the environment shapes to be removed from the group. Sorting the environment shapes based on the N characteristics results in an ordering of the environment shapes that makes it easy to identify the environment shapes satisfying (or not satisfying) the selection criterion, and also to identify non-unique environment shapes since non-unique environment shapes will appear consecutively in discrete groups as a result of the sorting. The sorting may be executed in accordance with N sort keys such that the N sort keys are the N independent characteristics.

Although sorting is a useful technique for step 38 of FIG. 6B, the scope of the present invention includes any method (sorting or otherwise) that would be known to a person of ordinary skill in the art for implementing the selection criterion and for removing non-unique error shapes.

Non-unique error shapes may be error shapes which are identical, or error shapes which are essentially not unique as determined by a non-uniqueness criterion. For example, a non-uniqueness criterion may be that two error shapes are essentially not unique if the two error shapes are identical in all respect except that the two error shape may differ in area by no more than a given percent (e.g., 0.01%) and the two error shape may differ in perimeter by no more than a given percent (e.g., 0.05%).

The reduction in the number of error shapes resulting from step 38 may be dramatic, because many error shapes may have identical or essentially identical environments and also because many error shapes may be deleted as a consequence of implementing the selection criterion of step 38. FIG. 7 is a table showing results in terms of the number of unique polygons resulting from applying the methodology of step 38 of FIG. 6B to a large number of environment shapes for each of several examples depicted in the table.

Figure 8:
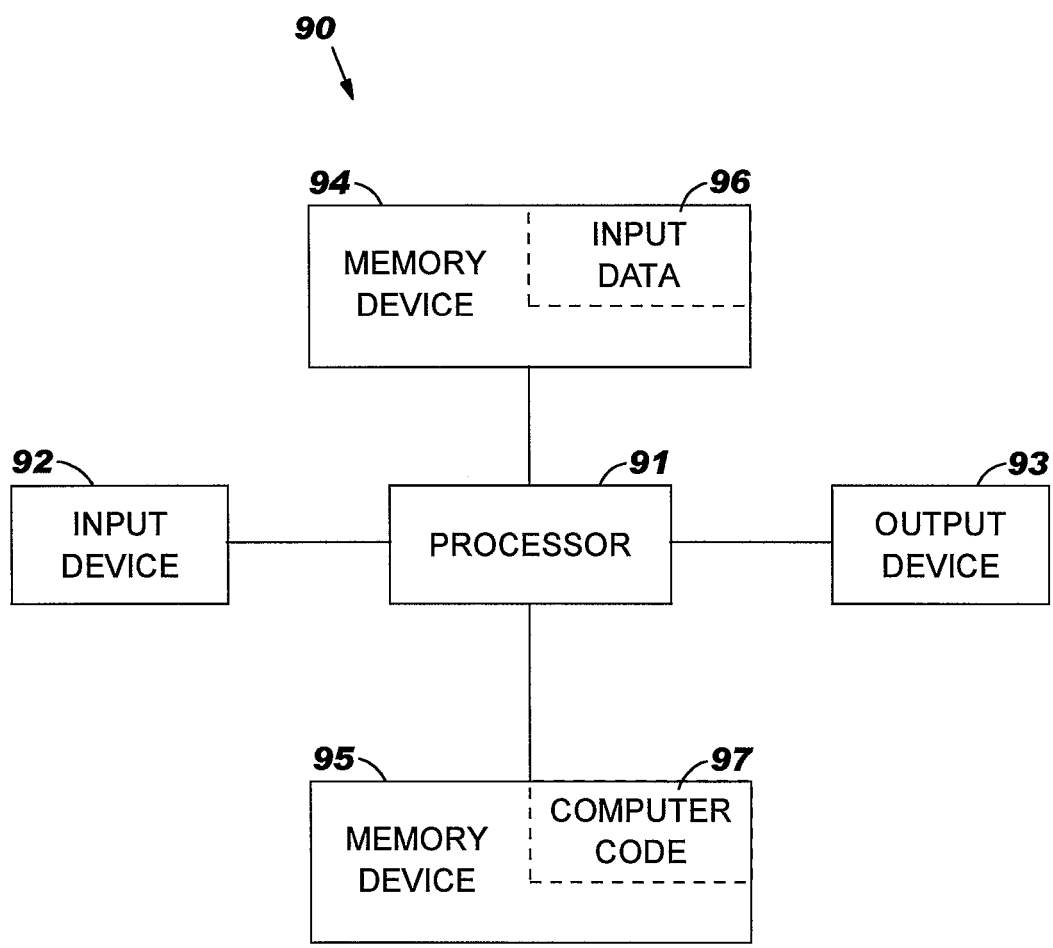
FIG. 8 illustrates a computer system for removing relatively unimportant error shapes from a set of error shapes, in accordance with embodiments of the present invention.

The method of flow chart 80 of FIGS. 6A-6B may be implemented by a using a computer system 90 discussed infra in conjunction with FIG. 8. The computer system 90 comprises a computer program product which includes a computer usable medium having a computer readable program code embodied therein. The computer readable program code implements the method such as through execution of an algorithm associated with the method.

FIG. 8 illustrates a computer system 90 for removing relatively unimportant error shapes from a set of error shapes, in accordance with embodiments of the present invention. The computer system 90 comprises a processor 91, an input device 92 coupled to the processor 91, an output device 93 coupled to the processor 91, and memory devices 94 and 95 each coupled to the processor 91. The input device 92 may be, inter alia, a keyboard, a mouse, etc. The output device 93 may be, inter alia, a printer, a plotter, a computer screen, a magnetic tape, a removable hard disk, a floppy disk, etc. The memory devices 94 and 95 may be, inter alia, a hard disk, a floppy disk, a magnetic tape, an optical storage such as a compact disc (CD) or a digital video disc (DVD), a dynamic random access memory (DRAM), a read-only memory (ROM), etc. The memory device 95 includes a computer code 97. The computer code 97 includes an algorithm for removing relatively unimportant error shapes from a set of error shapes (e.g., the algorithm 80 of FIGS. 6A-6B). The processor 91 executes the computer code 97. The memory device 94 includes input data 96. The input data 96 includes input required by the computer code 97. The output device 93 displays output from the computer code 97. Either or both memory devices 94 and 95 (or one or more additional memory devices not shown in FIG. 8) may be used as a computer usable medium (or a computer readable medium or a program storage device) having a computer readable program code embodied therein and/or having other data stored therein, wherein the computer readable program code comprises the computer code 97. Generally, a computer program product (or, alternatively, an article of manufacture) of the computer system 90 may comprise said computer usable medium (or said program storage device).

While FIG. 8 shows the computer system 90 as a particular configuration of hardware and software, any configuration of hardware and software, as would be known to a person of ordinary skill in the art, may be utilized for the purposes stated supra in conjunction with the particular computer system 90 of FIG. 8. For example, the memory devices 94 and 95 may be portions of a single memory device rather than separate memory devices.

While embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A method for reducing a number of shapes performed a computer system, said method comprising the steps of:
    forming a first shape pattern;
    forming a second shape pattern, wherein the second shape pattern consists of all of the first shape pattern and error shapes;
    extracting the error shapes from the second shape pattern;
    deriving from a subset of the extracted error shapes at least one environment shape corresponding to each error shape in the subset of the error shapes, said environment shape reflecting a local geometric environment of its corresponding error shape; and
    deleting a subset of the environment shapes such that only a plurality of unique environment shapes satisfying a selection criterion remain subject to the remaining unique environment shapes differing from each other with respect to a geometrical characteristic of their respective geometric shapes;
    wherein the deriving step comprises expanding each error shape in the subset to form a corresponding expanded shape and forming the at least one environment shape corresponding to each expanded shape by removing all portions of the expanded shape which are common to the second shape pattern;
    wherein each error shape in the subset has a polygonal shape;
    wherein expanding the first error shape comprises outwardly projecting each bounding side of the error share by a distance in a direction perpendicular to the bounding side;
    wherein the distance is a same first distance for each bounding side oriented in a first direction for a first error shape of the error shapes in the subset;
    wherein the distance is a same second distance for each bounding side oriented in a second direction for the first error shape;
    wherein the second direction is orthogonal to the first direction; and
    wherein the same first distance is unequal to the same second distance.

2. The method of claim 1, wherein the same first distance is identical for each error shape in the subset, and wherein the same second distance is identical for each error shape in the subset.

3. A method for reducing a number of shapes performed a computer system, said method comprising the steps of:
    forming a first shape pattern;
    forming a second shape pattern, wherein the second shape pattern consists of all of the first shape pattern and error shapes;
    extracting the error shapes from the second shape pattern;
    deriving from a subset of the extracted error shapes at least one environment shape corresponding to each error shape in the subset of the error shapes, said environment shape reflecting a local geometric environment of its corresponding error shape; and
    deleting a subset of the environment shapes such that only a plurality of unique environment shapes satisfying a selection criterion remain subject to the remaining unique environment shapes differing from each other with respect to a geometrical characteristic of their respective geometric shapes, wherein the step of forming the first shape pattern comprises adding at least one anchor to at least one initial geometric shape to form the first shape pattern, wherein a first anchor of the at least one anchor of the first shape pattern comprises a first extension, a first flare, and a second flare, wherein the first extension extends a first portion of the at least one initial geometric shape in a first direction, wherein the first flare and the second flare are disposed on opposite sides of the first portion, wherein the first flare extends the first portion in a second direction that is perpendicular to the first direction, wherein the second flare extends the first portion in a third direction that is opposite the second direction and perpendicular to the first direction.

4. The method of claim 3, wherein a second anchor of the at least one anchor of the first shape pattern consists of a second extension and a third flare, wherein the second extension extends a second portion of the at least one initial geometric shape in the first direction, and wherein the third flare extends the second portion in the third direction.

5. The method of claim 4, wherein said forming the second shape pattern comprises forming a first error shape by moving the second portion in the second direction.

6. The method of claim 5, wherein the deriving step comprises:
- expanding each error shape in the subset to form a corresponding expanded shape, wherein expanding the first error shape to form a corresponding first expanded shape comprises outwardly projecting each bounding side of the first error shape by a distance in a direction perpendicular to the bounding side; and
- forming the at least one environment shape corresponding to each expanded shape by removing all portions of the expanded shape which are common to the second shape pattern, wherein said forming the at least one environment shape comprises forming a first environment shape and a second environment shape corresponding to the first expanded shape by removing all portions of the first expanded shape which are common to the second shape pattern, wherein the formed first environmental shape is a polygon of 12 sides and is in direct mechanical contact with the second extension and the third flare, wherein the formed second environmental shape is a rectangle and is in direct mechanical contact with the third flare, and wherein the third flare is disposed between the first and second environmental shapes and separates the first and second environmental shapes from each other.

7. The method of claim 5, wherein a third anchor of the at least one anchor of the first shape pattern consists of a fourth flare disposed on a third portion of the at least one initial geometric shape.

8. The method of claim 7, wherein said forming the second shape pattern further comprises simultaneously forming a second error shape and a third error shape of the error shapes by shifting the third portion together with the fourth flare in a fourth direction that is opposite the first direction.

9. The method of claim 8, wherein the second error shape and the third error shape have a same thickness in the fourth direction, wherein the second error shape is an additive error shape that physically exists in the second shape pattern, and wherein the third error shape is a subtractive error shape that logically exists in the second shape pattern.

\* \* \* \* \*